(12) United States Patent
Yang et al.

(10) Patent No.: US 9,778,324 B2
(45) Date of Patent: Oct. 3, 2017

(54) YOKE CONFIGURATION TO REDUCE HIGH OFFSET IN X-, Y-, AND Z-MAGNETIC SENSORS

(71) Applicant: Apple Inc., Cupertino, CA (US)

(72) Inventors: Henry H. Yang, Los Gatos, CA (US); Hyuk J. Choi, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 238 days.

(21) Appl. No.: 14/856,302

(22) Filed: Sep. 16, 2015

(65) Prior Publication Data

US 2016/0306015 A1 Oct. 20, 2016

Related U.S. Application Data

(60) Provisional application No. 62/149,273, filed on Apr. 17, 2015.

(51) Int. Cl.
*G01C 17/28* (2006.01)
*G01R 33/00* (2006.01)
*G01R 33/09* (2006.01)

(52) U.S. Cl.
CPC ........ *G01R 33/0011* (2013.01); *G01R 33/093* (2013.01)

(58) Field of Classification Search
CPC .......................... G01R 33/0011; G01R 33/093
USPC .......................................................... 33/361
See application file for complete search history.

(56) References Cited

U.S. PATENT DOCUMENTS

| | | | |
|---|---|---|---|
| 6,636,391 B2 | 10/2003 | Watanabe et al. | |
| 8,056,246 B1* | 11/2011 | Hopper | G01C 9/06 33/366.11 |
| 8,242,776 B2 | 8/2012 | Mather et al. | |
| 8,441,255 B1* | 5/2013 | Davis | G01R 33/093 324/207.21 |
| 8,952,689 B2 | 2/2015 | Ide et al. | |
| 2009/0293294 A1* | 12/2009 | Kitaura | G01R 33/0206 33/355 R |
| 2010/0045285 A1* | 2/2010 | Ohmori | B82Y 25/00 324/260 |

(Continued)

OTHER PUBLICATIONS

Chunrui Han et al., "Visible broadband magnetic response from Ag chiral Z-shaped nanohole array", Jan. 2015, Department of Physics and William Mong Institute of Nano Science and Technology, The Hong Kong University of Science and Technology, Clear Water Bay, Kowloon, Hong Kong, China.

*Primary Examiner* — G. Bradley Bennett
(74) *Attorney, Agent, or Firm* — Treyz Law Group, P.C.; G. Victor Treyz

(57) ABSTRACT

An electronic device may be provided with an electronic compass. The electronic compass may include magnetic sensors. The magnetic sensors may include thin-film magnetic sensor elements such as giant magnetoresistance sensor elements. Magnetic flux concentrators may be used to guide magnetic fields through the sensor elements. The magnetic flux concentrators may be configured to reduce the angular sensitivity of the magnetic sensors. A magnetic flux concentrator may be formed from multiple stacked layers of soft magnetic material separated by non-magnetic material. The non-magnetic material may have a thickness allows the magnetic layers to magnetically couple through the Ruderman-Kittel-Kasuya-Yosida (RKKY) interaction.

20 Claims, 11 Drawing Sheets

(56) References Cited

U.S. PATENT DOCUMENTS

| | | | |
|---|---|---|---|
| 2012/0151786 A1* | 6/2012 | Ohmori | G01C 17/30 33/361 |
| 2012/0268113 A1 | 10/2012 | Sato et al. | |
| 2016/0116283 A1* | 4/2016 | Deak | G01C 17/28 33/361 |
| 2016/0202329 A1* | 7/2016 | Paci | G01R 33/0052 324/252 |
| 2017/0082698 A1* | 3/2017 | Choi | G01R 33/093 |
| 2017/0123016 A1* | 5/2017 | Deak | G01R 33/0206 |

* cited by examiner

యోక్ CONFIGURATION TO REDUCE HIGH
YOKE CONFIGURATION TO REDUCE HIGH OFFSET IN X-, Y-, AND Z-MAGNETIC SENSORS

This application claims the benefit of and claims priority to provisional patent application No. 62/149,273 filed Apr. 17, 2015, which is incorporated by reference herein in its entirety.

BACKGROUND

This relates generally to electronic devices, and, more particularly, to electronic devices with electronic compasses.

Electronic devices such as cellular telephones may contain electronic compasses. An electronic compass includes magnetic sensors that detect the Earth's magnetic field. Compass readings may be used to provide orientation information to a navigation application or to other programs that use magnetic sensor data.

The magnetic sensors in electronic compasses may be formed from thin-film sensor structures. Magnetic flux concentrators are used to guide and amplify ambient magnetic fields, thereby enhancing the ability of thin-film sensors to detect weak fields such as the Earth's magnetic field. The magnetic flux concentrators are formed from soft magnetic materials.

Magnetic structures in a magnetic sensor such as the magnetic materials in a magnetic flux concentrator can become magnetized upon exposure to magnetic fields. For example, a magnetic flux concentrator may become magnetized when an external magnet or other source of a large external magnetic field is brought into the vicinity of the magnetic flux concentrator. The magnetization of a flux concentrator that has been exposed to magnetic fields in this way will relax to a remnant state upon removal of the external magnetic field. A remnant state will typically be characterized by a complex pattern of magnetic domains. This pattern of magnetic domains can give rise to a leakage flux that creates an undesired offset in the electronic compass. The offset can introduce inaccuracies in magnetic field readings and can limit the dynamic range of the electronic compass.

In some compass designs, magnetic flux concentrators have shapes that cause the compass to be more sensitive to magnetic fields with one angular orientation than another. If care is not taken, this angular sensitivity can give rise to inaccuracies in magnetic field readings.

It would therefore be desirable to be able to provide improved flux concentrators for magnetic compasses.

SUMMARY

An electronic device may be provided with an electronic compass. The electronic compass may include magnetic sensors. The magnetic sensors may include an X-axis sensor, a Y-axis sensor, and a Z-axis sensor.

The magnetic sensors may include thin-film magnetic sensor elements such as giant magnetoresistance sensor elements. Magnetic flux concentrators may be used to guide magnetic fields through the sensor elements. The magnetic flux concentrators may have a balanced set of shapes to reduce the angular sensitivity of the magnetic sensors.

Magnetic flux concentrators may be formed from multiple thin stacked layers of soft magnetic material separated by non-magnetic material. The non-magnetic material may have a thickness that is sufficiently small to allow the magnetic layers to magnetically couple through the Ruderman-Kittel-Kasuya-Yosida (RKKY) interaction.

DETAILED DESCRIPTION

Figure 1:
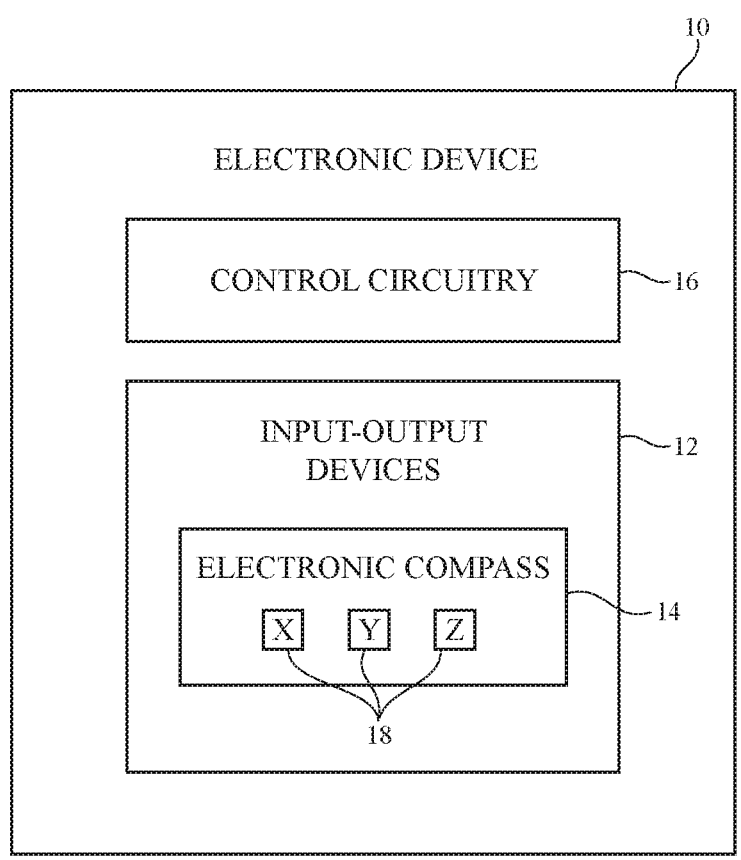
FIG. 1 is a schematic diagram of an illustrative electronic device having a magnetic sensor such as an electronic compass in accordance with an embodiment.

An illustrative electronic device of the type that may be provided with magnetic sensor circuitry such as an electronic compass is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, displays, etc. A user can control the operation of device 10 by supplying commands through input-output devices 12 and may receive status information and other output from device 10 using the output resources of input-output devices 12.

Control circuitry 16 may be used to run software on device 10 such as operating system code and applications. During operation of device 10, the software running on control circuitry 16 may control device 10 using information from sensors and other input-output devices.

Device 10 may be a tablet computer, a laptop computer, a desktop computer, a display, a cellular telephone or other portable device, a media player, a wristwatch device or other wearable electronic equipment, part of an embedded system that includes a display and/or other components, or other suitable electronic device.

Input-output devices 12 may include one or more magnetic sensors. The magnetic sensors may be used to measure the Earth's magnetic field or other magnetic fields. With one suitable arrangement, which is sometimes described herein as an example, devices 12 include an electronic compass such as electronic compass 14 for measuring the Earth's magnetic field (and, if desired, other external magnetic fields). Electronic compass 14 may be, for example, a three-axis magnetic sensor having magnetic sensors 18 for three orthogonal directions (e.g., X-axis and Y-axis magnetic sensors for making magnetic field measurements along lateral X and Y dimensions and a Z-axis magnetic sensor for making magnetic field measurements along vertical dimension Z).

Magnetic sensors 18 may include thin-film magnetic sensor elements such as thin-film magnetoresistance sensor elements. Thin-film magnetoresistance sensor elements may be based on anisotropic magnetoresistance (AMR) effects, may be based on giant magnetoresistance (GMR) effects, or may be based on tunneling magnetoresistance (TMR) effects. Other types of sensors 18 may be used, if desired. Configurations in which the magnetic sensor elements for compass 14 are based on giant magnetoresistance effects are sometimes described herein as an example. This is, however, merely illustrative. Compass 14 may sense magnetic fields using any suitable type of magnetic sensor.

Figure 2:
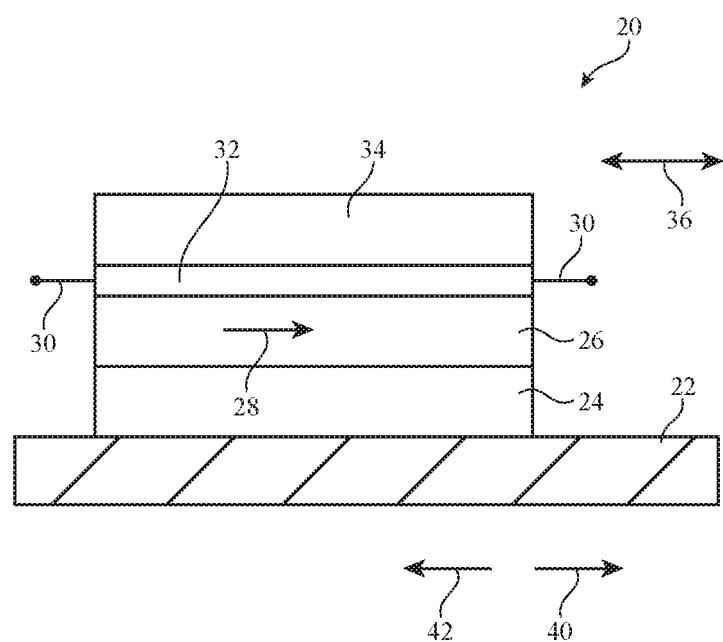
FIG. 2 is a cross-sectional side view of an illustrative thin-film magnetic sensor element in accordance with an embodiment.

A cross-sectional side view of an illustrative giant magnetoresistance magnetic sensor element is shown in FIG. 2. As shown in FIG. 2, thin-film magnetic sensor element 20 (e.g., a giant magnetoresistance sensor element) may include a stack of thin-film structures formed on substrate 22. Pinning layer 24 may be formed from a material such as FeMn, CrMn, IrMn, or PtMn. Pinned layer 26 may be formed from a magnetic material such as NiFe, CoFe, or NiCo. Magnetic field 28 in pinned layer 26 has a fixed orientation that is established by pinning layer 24. Magnetic layer 34 may be formed on top of layer 26. A non-magnetic layer 32 such as a layer of Cu or Al—Cu may be formed between layers 34 and 26. The resistance of layer 32 may be monitored at terminals 30. Magnetic layer 34 is a free layer (sometimes referred to as a sense layer) having a magnetic field that reflects the state of external magnetic field 36. When, for example, magnetic field 36 is oriented in direction 40, the magnetic field in layer 34 will be oriented in direction 40 and will be parallel to magnetic field 28. In this situation, the electrical resistance in layer 32 will have a first value. When external magnetic field 36 is oriented in direction 42, the magnetic field in layer 34 will be oriented in direction 42 and will be antiparallel to magnetic field 28. When the magnetic fields in layers 34 and 26 are antiparallel, the electrical resistance in layer 32 will have a second value that is greater than the first value. Changes in resistance in layer 32 may therefore be used to measure external magnetic field 36. If desired, other configurations may be used for thin-film magnetic sensor elements in sensors 18. The illustrative configuration of FIG. 2 is presented as an example.

Magnetic sensor elements such as thin-film giant magnetoresistance magnetic sensor element 20 of FIG. 2 may exhibit desirable attributes such as low power consumption. Magnetic flux concentrators that are formed from soft magnetic materials may be used to amplify ambient magnetic fields and to direct ambient magnetic fields through the thin-film sensor elements. The shape of the flux concentrators (which may sometimes be referred to a flux guides, flux directing structures, magnetic flux concentrating yokes, etc.) may be different for the different axes in compass 14. Thin-film magnetic sensors that lie in the horizontal (X-Y) plane may use flux concentrators that redirect fields within the X-Y plane. Magnetic field measurements that are made on vertically oriented magnetic fields (i.e., magnetic fields running along out-of-plane axis Z) may be made using a flux concentrator of the type shown in FIG. 3.

Figure 3:
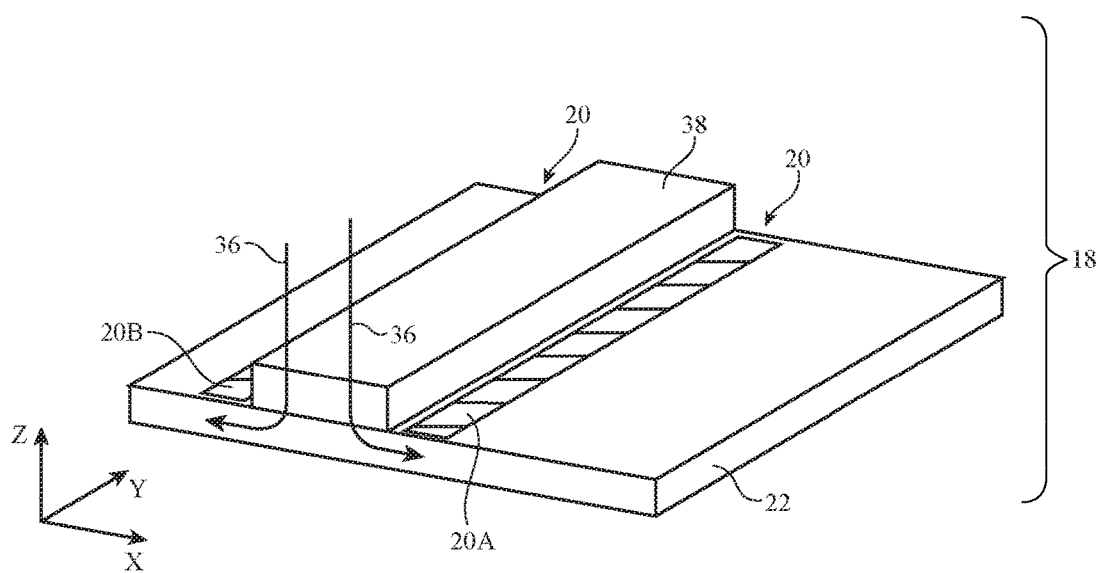
FIG. 3 is a perspective view of an illustrative Z-axis magnetic sensor in accordance with an embodiment.

As shown in FIG. 3, magnetic sensor 18 may include sensor elements 20 and magnetic flux concentrator 38. Magnetic flux concentrator 38 may redirect out-of-plane magnetic fields 36 that are parallel to the Z-axis so that they pass horizontally through sensor elements 20 (i.e., parallel to dimension X in the example of FIG. 3). Flux concentrator 38 may have an elongated rectangular box shape or other suitable shape. The length of flux concentrator 38 along axis Y may, for example, be tens or hundreds of microns or other suitable length. The width of flux concentrator 38 along axis X may be 1-10 microns, 2-20 microns, 3-8 microns, less than 9, more than 1 micron, less than 20 microns, 5-15 microns, or other suitable width. The height of flux concentrator 38 along dimension Z may be 1-20 microns, 5-15 microns, less than 13 microns, more than 7 microns, or other suitable height.

Magnetic sensor elements 20 may include first and second elongated thin-film magnetic sensor elements 20A and 20B that extend along the opposing edges of flux concentrator 38. When oriented as shown in FIG. 3, sensor element 20A may register an increase in resistance whenever sensor element 20B registers a decrease in resistance. Sensor elements 20A and 20B may therefore sometimes be referred to as positive and negative sensor elements (positive and negative sensors) and may be placed in respective positive and negative arms of a resistive bridge circuit or other circuit to facilitate resistance measurements.

Figure 4:
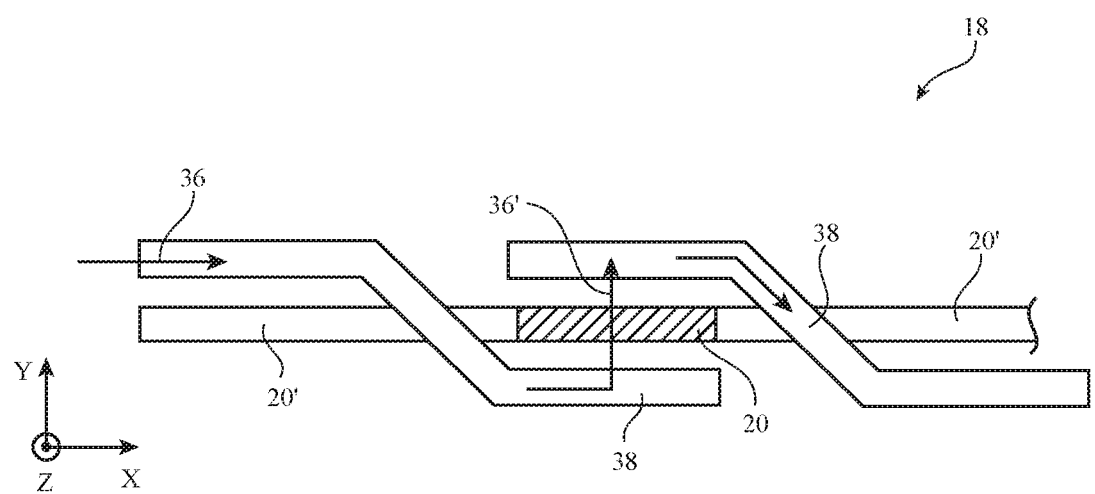
FIG. 4 is a top view of an illustrative X-axis or Y-axis magnetic sensor in accordance with an embodiment.

A top view of an illustrative flux concentrator of the type that may be used to direct and amplify magnetic field 36 when making magnetic field measurements on magnetic field 36 that is in the X-Y plane is shown in FIG. 4. In the example of FIG. 4, sensor 18 is an X-axis magnetic sensor. Incoming magnetic field 36 along axis X is directed through active region 20 of a strip of thin-film magnetoresistance sensor structures (strip 20') by magnetic flux concentrators 38 (see, e.g., magnetic field 36', which is measured by active region 20). Flux concentrators 38 may have a Z-shape or other suitable shape. Flux concentrators such as flux concentrators 38 of FIG. 4 may have lengths of 10-50 microns, less than 50 microns, more than 10 microns, or other suitable length, may have widths of 1-20 microns, more than 1 micron, less than 15 microns, less than 20, more than 4 microns, 3-15 microns, or other suitable width, and may have heights (i.e., thicknesses in dimension Z) that are 1-20 microns, less than 4 microns, 1-3 microns, less than 2.5 microns, 0.1-5 microns, 0.2-4 microns, 0.5-5 microns, more than 0.5 microns, more than 1 micron, less than 20 microns, or other suitable thickness.

If desired, other flux concentrator designs may be used for forming the flux concentrator structures in sensors 18 of compass 14. The configurations shown FIGS. 3 and 4 are merely illustrative.

Figure 5:
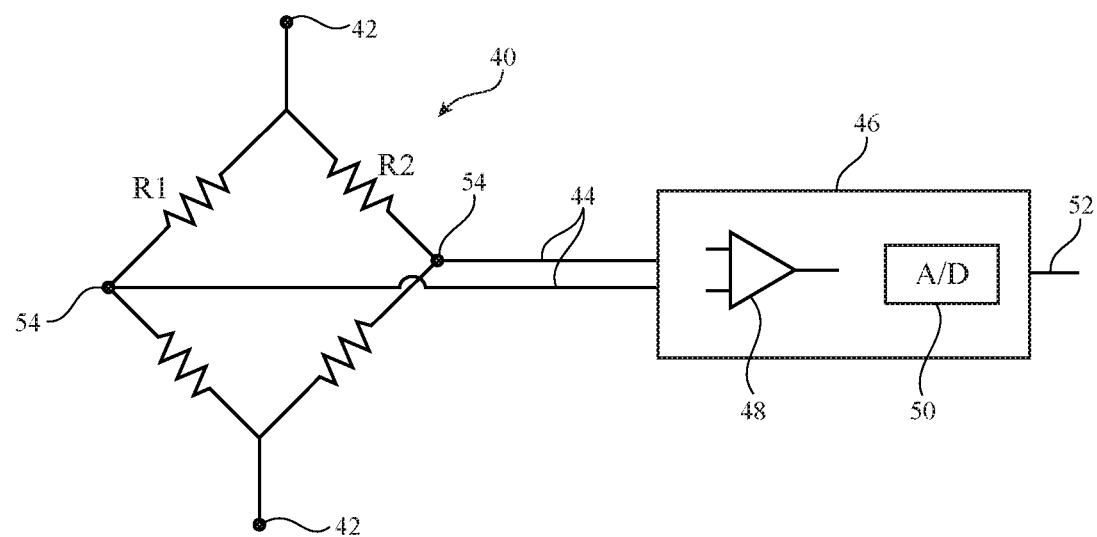
FIG. 5 is a schematic diagram of illustrative circuitry for measuring the resistance of magnetic sensor elements in accordance with an embodiment.

FIG. 5 is an illustrative resistive bridge circuit (i.e., a Wheatstone bridge) of the type that may be used to measure the resistance(s) of one or more magnetic sensor elements 20. In the example of FIG. 5, resistance R1 corresponds to a first magnetic sensor element (e.g., positive element 20A of FIG. 3) and resistance R2 corresponds to a second magnetic sensor element (e.g., negative element 20B of FIG. 3). Reference voltages are applied to terminals 42 of bridge circuit 40. Paths 44 may be used to convey signals from nodes 54 to measurement circuit 46 (e.g., part of control circuitry 16 of FIG. 1). Circuit 46 may contain components such as differential amplifier 48 for producing an output that is proportional to the voltage difference across nodes 54. Analog-to-digital converter 50 may convert this output to a digital output on path 52. The output on path 52 will be proportional to the resistance of sensor elements 20 and will therefore reflect the strength of external magnetic field 36 that is being measured by the magnetic sensor elements in the bridge circuit.

When external magnetic fields of sufficient strength are applied to compass 14, the soft magnetic material of the flux concentrators can become magnetized. The patterns of magnetic domains that are established in magnetized flux concentrators can lead to offsets in the readings of magnetic sensors 18 and therefore compass 14. Magnetic field inaccuracies may also be caused by the shapes of the flux concentrators. For example, a sensor that has Z-shaped magnetic flux concentrators may exhibit excessive sensitivity when a magnetic field that is being measured is aligned with the middle segments of the Z-shaped concentrators. Offsets and uneven angular sensitivity can lead to undesired measurement inaccuracies when measuring magnetic fields.

With one suitable arrangement, undesired offsets may be minimized by forming magnetic flux concentrators with magnetically stable multilayer configurations. Flux concentrators 38 may also be configured so that structures that tend to enhance sensitivity at a given magnetic field angle are balanced by structures that tend to reduce sensitivity at the same magnetic field angle.

Figure 6:
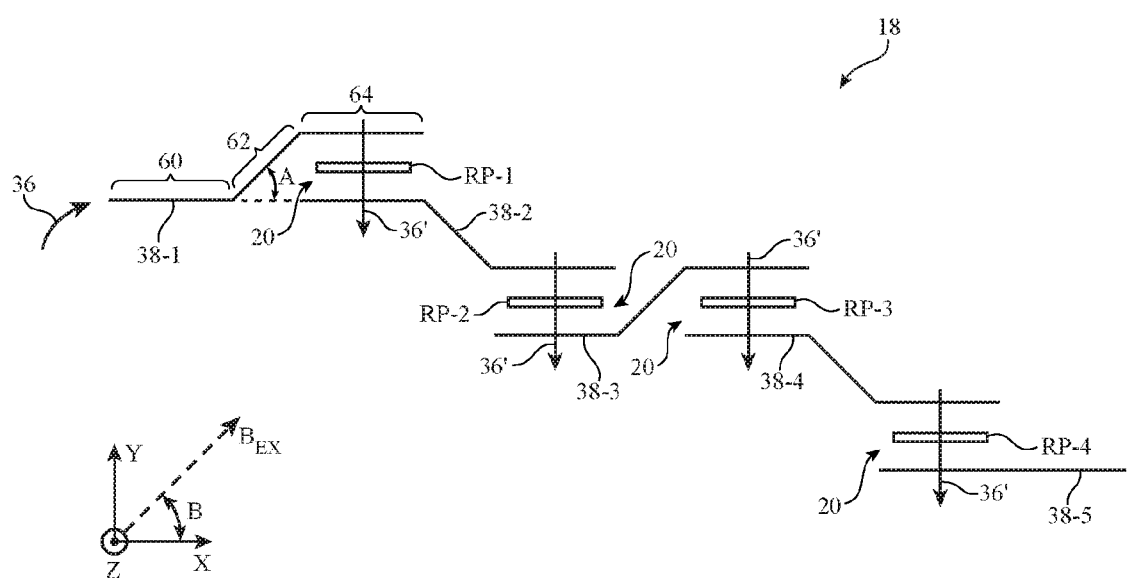
FIG. 6 is a top view of an illustrative magnetic sensor configuration of the type that may be used to form a positive sensor for the positive arm of a bridge circuit in accordance with an embodiment.
Figure 7:
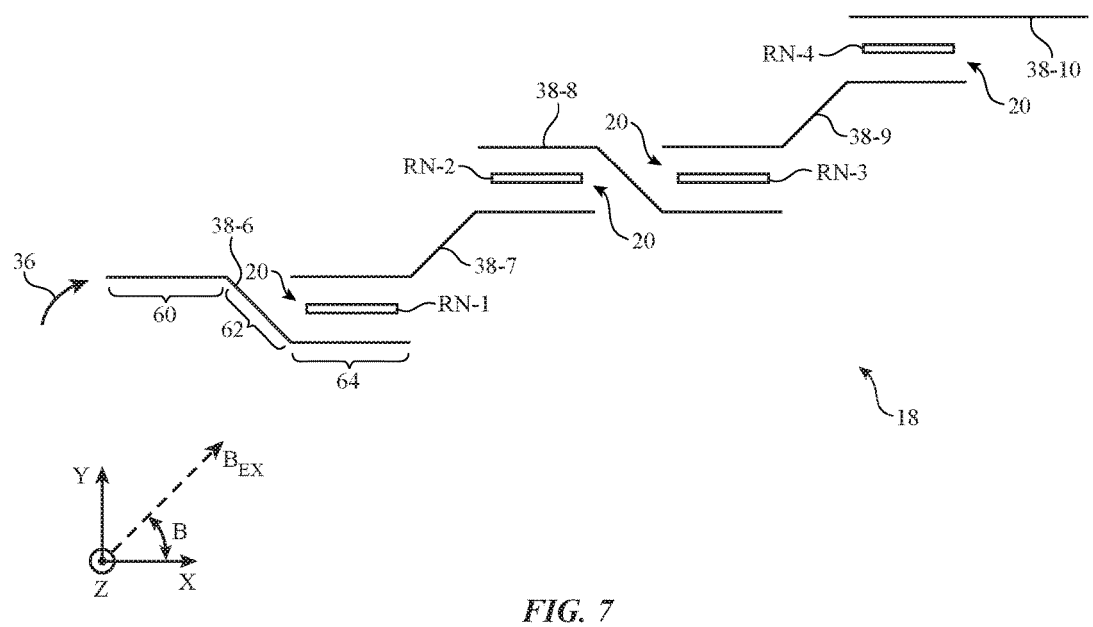
FIG. 7 is a top view of an illustrative magnetic sensor configuration of the type that may be used to form a negative sensor for the negative arm of a bridge circuit in accordance with an embodiment.

An illustrative arrangement that may be used to reduce angular sensitivity is shown in FIGS. 6 and 7. In this illustrative arrangement, the structures of FIG. 6 are used to form a positive sensor arm in a bridge circuit and the structures of FIG. 7 are used to form a negative sensor arm in the bridge circuit. Sensor 18 of FIG. 6 may therefore be referred to as a positive magnetoresistance sensor and sensor 18 of FIG. 7 may be referred to as a negative magnetoresistance sensor. The positive and negative sensors may each include multiple sensor elements 20. Resistance measurements from these elements 20 can be added to each other to increase signal strength (e.g., the resistances of the elements 20 in the positive sensor can be added to each other and the resistances of the elements 20 in the negative sensor can be added to each other.

Due to the orientation of concentrators 38 and elements 20 in the positive and negative sensors, the positive sensor exhibits a positive resistance change in its elements 20 whenever the negative sensor exhibits a negative resistance change in its elements 20 in the presence of external field 36.

If desired, a pair of positive sensors may be located in diagonally opposing arms of a Wheatstone bridge and a pair of negative sensors may be located in diagonally opposing arms of the same Wheatstone bridge. Configurations in which the positive and negative sensors are located in first and second Wheatstone bridge arms may also be used. Moreover, resistance measurement circuits other than Wheatstone bridge circuits may also be used in measuring sensor resistances. The use of positive and negative sensors of the types shown in FIGS. 6 and 7 in a bridge circuit to form a magnetic sensor 18 in compass 14 is merely illustrative.

Sensors 18 of FIGS. 6 and 7 have magnetic flux concentrators that extend along dimension X for making X-axis magnetic field measurements (i.e., positive sensor 18 of FIG. 6 and negative sensor 18 of FIG. 7 are collectively used in forming an X-axis magnetoresistance sensor 18). A Y-axis sensor may use the same type of structures when the magnetic sensors and sensor elements run along the Y dimension. The use of the structures of FIGS. 6 and 7 to form an X-axis magnetic sensor for compass 14 is presented as an example.

In the example of FIG. 6, sensor 18 has four thin-film magnetoresistance sensor elements 20. Magnetic flux concentrators 38 include two Z-shaped magnetic flux concentrators 38-2 and 38-4. Magnetic flux concentrators 38 also include two reversed-Z-shaped magnetic flux concentrators 38-1 and 38-3. Magnetic flux concentrator 38-5 has a straight bar shape. Magnetic field 36' that has been directed through sensor elements 20 results in changes in the resistances of these elements. These resistances (RP-1, RP-2, RP-3, and RP-4) may be added together to enhance the signal-to-noise ratio of sensor 18.

Each of flux concentrators 38 (Z-shaped and reversed-Z-shaped) has first and second parallel segments 60 and 64 that are joined by an angled intermediate segment 62. In the Z-shaped concentrators, intermediate segments 62 are oriented at an angle A of 45° with respect to parallel segments 60 and 64 (i.e., segments 60 and 64 run parallel to axis X). In the reversed-Z-shaped concentrators, intermediate segments 62 are oriented at an angle A of −45° with respect to parallel segments 60 and 64.

The angular orientation of the intermediate segments in the flux concentrators tends to enhance magnetic field sensitivity in directions that are aligned with the intermediate segments. Consider, as an example, a scenario in which it is desired to measure an external magnetic field Bex that is oriented at an angle B of 45° with respect to axis X. Sensor 18 of FIG. 6 is primarily sensitive to X-axis fields, but because illustrative field Bex is aligned with the intermediate segments 62 of reversed-Z-shaped magnetic flux concentrators 38-1 and 38-3, these portions of the flux concentrators will tend to gather more magnetic flux than segments that are oriented in other directions. Positive magnetic sensor 18 of FIG. 6 may therefore exhibit locally enhanced sensitivity from the reversed-Z concentrators at magnetic field orientations of 45°.

Due to the presence of segments 62 of concentrators 38-2 and 38-4 sensor 18 of FIG. 6 will also exhibit enhanced response for magnetic fields that are oriented at −45°.

Sensor 18 of FIG. 7 can be implemented using a mirror image layout of the flux concentrators of FIG. 6. As with positive sensor 18 of FIG. 6, negative X-axis sensor 18 of FIG. 7 contains two Z-shaped flux concentrators (concentrators 38-6 and 38-8) and two reversed-Z-shaped flux concentrators (38-7 and 38-9). Flux concentrator 38-10 may have a straight bar shape. When exposed to illustrative magnetic field Bex, which is oriented at an angle B of 45° with respect to axis X, segments 62 of reversed-Z-shaped concentrators 38-7 and 38-9 will tend to gather more magnetic flux than Z-shaped concentrators 38-6 and 38-8. When exposed to a field at −45°, the reversed-Z-shaped concentrators will gather less flux than the Z-shaped concentrators.

The complementary layouts of the positive and negative sensors 18 allows off-axis sensing errors in the positive sensor to be cancelled by identical off-axis sensing errors in the negative sensor when these sensors are placed in a bridge circuit. The numbers of Z-shaped and reversed-Z-shaped concentrators in positive sensor 18 are matched by the numbers of Z-shaped and reversed-Z-shaped concentrators in negative sensor 18, so the angular responses of the positive and negative sensors are balanced with respect to each other.

Figure 8:
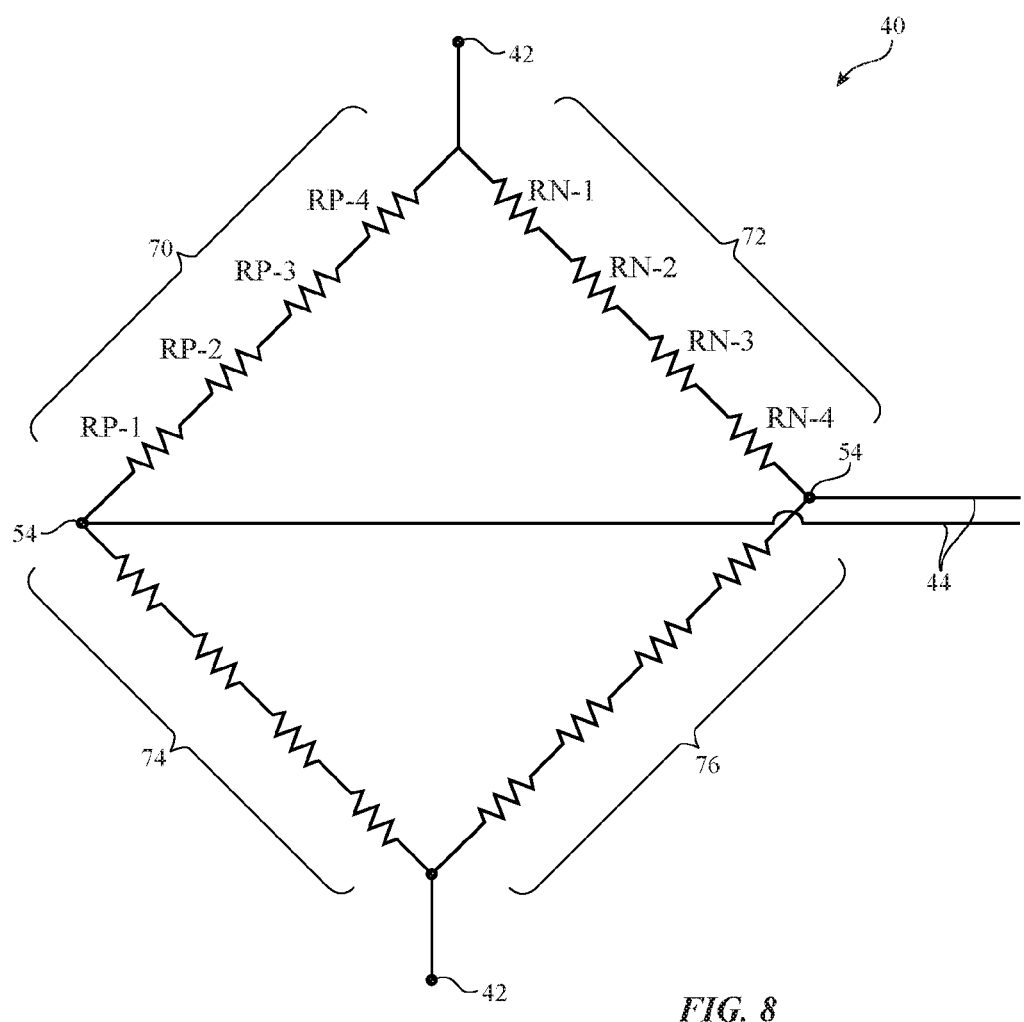
FIG. 8 is a circuit diagram of an illustrative bridge circuit for a magnetic sensor that may include positive and negative sensor arms of the types shown in FIGS. 6 and 7 in accordance with an embodiment.

An illustrative bridge circuit into which the sensor elements of FIGS. 6 and 7 may be incorporated is shown in FIG. 8. As shown in FIG. 8, bridge circuit 40 may have arms 70, 72, 74, and 76. The positive sensor of FIG. 6 may be located in arm 70 and the negative sensor of FIG. 7 may be located in arm 72. Arms 74 and 76 may be provided with reference resistors or arm a duplicate of positive sensor 70 may be incorporated into arm 76 and a duplicate of negative sensor 72 may be placed in arm 74 to enhance the signal-to-noise ratio of the output signal across terminals 54.

If desired, the stability of the magnetic domain pattern in flux concentrators 38 may be enhanced by using multiple layers of magnetically coupled soft magnetic material in forming flux concentrators 38. The magnetic layers may be sufficiently thin to encourage magnetic domains to remain oriented within the plane of the flux concentrator. A non-magnetic coupling layer may be located between the magnetic layers and may have a configuration that encourages magnetic coupling between the magnetic layers. Magnetic flux concentrators with this type of configuration may be characterized by stable magnetic domain patterns (e.g., all magnetic domains may be oriented in alternating directions in alternating magnetic layers due to the magnetic coupling between layers). A multilayer flux concentrator will therefore be less likely to acquire a magnetic domain pattern that produces an unexpected and undesired magnetic sensor offset in compass 14.

Figure 9:
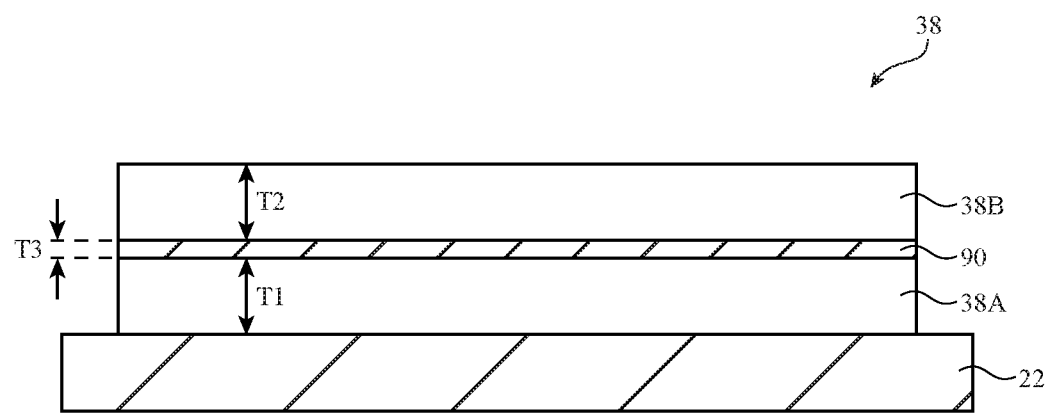
FIG. 9 is a cross-sectional side view of an illustrative magnetic flux concentrator with stacked magnetic layers separated by a non-magnetic layer in accordance with an embodiment.

A cross-sectional side view of an illustrative flux concentrator with a multilayer configuration is shown in FIG. 9. As shown in FIG. 9, flux concentrator 38 may have a first magnetic layer such as magnetic layer 38A, a non-magnetic layer such as layer 90, and a second magnetic layer such as magnetic layer 38B. Additional magnetic layers and non-magnetic layers may be included in the stack of magnetic layers for concentrator 38 if desired (e.g., flux concentrator 38 may have two or more layers of magnetic material, three or more layers of magnetic material, four or more layers of magnetic material, etc.).

Magnetic layers 38A and 38B may be formed from a magnetic material such as NiFe (permalloy), NiP, CoFe, or other soft magnetic materials. Layers 38A and 38B may each contain a single non-magnetic material or may be formed from stacks of two or more layers of soft magnetic materials. As an example, layer 38B may include an upper layer of NiFe (e.g., an electroplated layer of about 0.5-5 microns on a sputter-deposited layer of about 5 nm) and a lower layer of CoFe (e.g., a 1 nm layer), whereas layer 38A may include an upper layer of CoFe (e.g., a layer that is 1 nm thick) and a lower layer of NiFe (e.g., a sputtered NiFe layer that is 5 nm thick on an electroplated NiFe layer of about 0.5-5 microns). Other layer thicknesses may be used, if desired. Non-magnetic layer 90 may be formed from a layer of copper, ruthenium, or other non-magnetic material. The thickness T3 of non-magnetic layer 90 may be less than 0.2 microns, less than 0.1 microns, more than 0.01 microns, or other suitable thickness that allows layers 38A and 38B to magnetically couple. With one suitable configuration, the thickness T3 of layer 90 may be about 8 angstroms (e.g., 6-11 angstroms) or other suitable thickness that promotes magnetic coupling due to the Ruderman-Kittel-Kasuya-Yosida (RKKY) interaction. The Ruderman-Kittel-Kasuya-Yosida interaction is a magnetic coupling mechanism that can strongly couple the magnetic fields of layers 38A and 38B (e.g., so that the north-south alignment of the field in layer 38A and 38B are opposite to each other) and thereby enhance the stability of the magnetic domain pattern in flux concentrator 38.

The thicknesses T1 and T2 of magnetic layers 38A and 38B may be less than 1 micron, or larger thicknesses may be used if desired (e.g., thicknesses T1 and T2 may be less than 2 microns, may be more than 0.2 microns, etc.). Thickness T1 may be equal to thickness T2 or thicknesses T1 and T2 may differ.

An illustrative process for forming a magnetic flux concentrator from a stack of thin magnetic layers is shown in FIGS. 10, 11, 12, 13, and 14.

Figure 10:
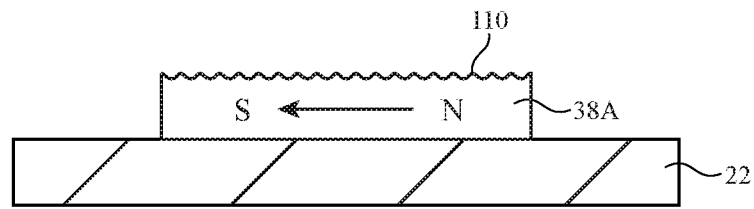
FIGS. 10, 11, 12, 13, and 14 are cross-sectional side views of a multilayer magnetic flux concentrator during a series of illustrative fabrication steps in accordance with an embodiment.

Initially, a first magnetic layer such as magnetic layer 38A may be deposited and patterned on substrate 22, as shown in FIG. 10. Magnetic layer 38A may be formed on substrate 22 using electroplating or other suitable deposition techniques. For example, layer 38A may be formed by plating a layer of NiFe about 0.5-5 microns thick followed by sputter deposition of a NiFe layer of 5 nm in thickness and sputter deposition of a CoFe layer of 1 nm in thickness. The plating process or other deposition process used to form layer 38A may cause upper surface 100 to exhibit surface roughness in excess of what is desired for forming a thin (e.g., 8 angstrom) Ruderman-Kittel-Kasuya-Yosida coupling layer on layer 38A. Accordingly, chemical mechanical polishing (CMP) or other smoothing techniques may be used to smooth surface 100.

Figure 11:
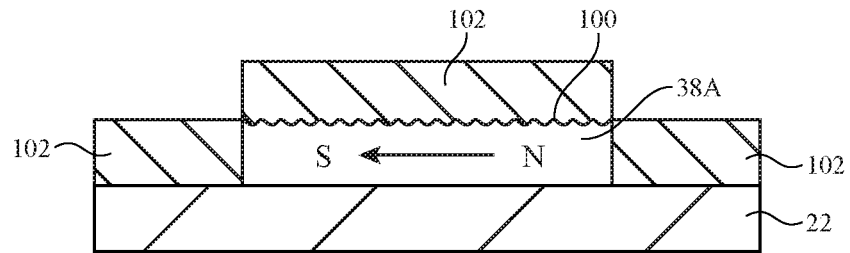
Figure 12:
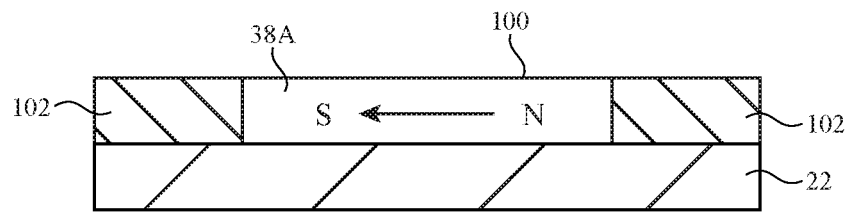
Figure 13:
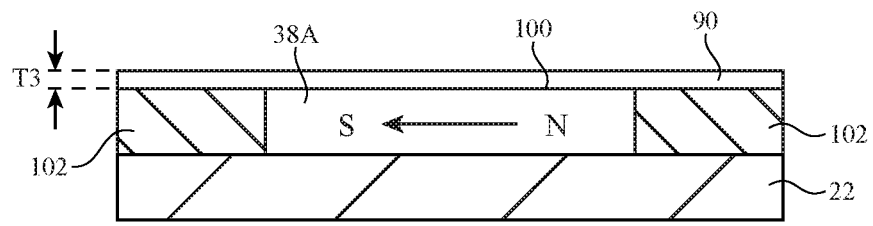
Figure 14:
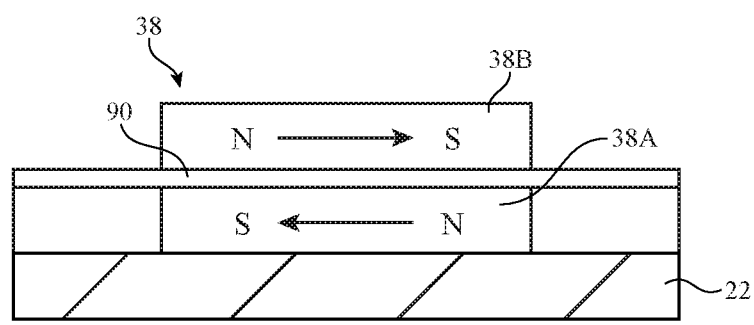

In the example of FIGS. 11 and 12, surface 100 is smoothed using chemical mechanical polishing techniques. Initially, aluminum oxide layer 102 is deposited over layer 38A, as shown in FIG. 11. Layer 102 is hard and promotes the formation of planar polished surfaces. Following CMP polishing of the structures of FIG. 11, surface 100 of layer 38A is smooth as shown in FIG. 12 and is ready to accept a layer of non-magnetic material. Non-magnetic layer 90 may therefore be deposited on polished surface 100, as shown in FIG. 13. Layer 90 may be a layer of copper, ruthenium, or other non-magnetic material with a thickness that helps promote Ruderman-Kittel-Kasuya-Yosida coupling between the magnetic layers of concentrator 38. Layer 90 may be formed by depositing a 5 nm magnetic layer of a material such as NiFe layer, an eight angstrom (or 6-11 angstrom) layer of copper, ruthenium, or other non-magnetic material (e.g., a sputtered layer), and another 5 nm magnetic layer such as a layer of NiFe. The NiFe that is deposited in this way may serve as a seed layer for subsequent plating operations. As shown in FIG. 14, for example, second magnetic layer 38B may be formed on top of layer 90 by electroplating, sputter deposition, and patterning layer 38B. For example, layer 38B may be formed by sputter deposition of a 1 nm CoFe layer, sputter deposition of a 5 nm NiFe layer, and electroplating of a thicker NiFe layer (e.g., a layer of about 0.5-5 microns in thickness). Layer 38B overlaps layer 38A to form stacked flux concentrator 38. Because layers 38B and 38A are magnetically coupled (e.g., through the Ruderman-Kittel-Kasuya-Yosida coupling mechanism), the orientation of the remnant magnetic field in layer 38A (south to north in the FIG. 14 example) is opposite to the orientation of the remnant magnetic field in layer 38B (north to south in the FIG. 14 example). The magnetic domains in layers 38A and 38B are therefore organized in a stable pattern that will resist unwanted disorderly magnetization patterns when exposed to external magnetic fields. As a result, use of magnetic flux concentrator 38 of FIG. 14 will help reduce offset in electronic compass 14.

Figure 15:
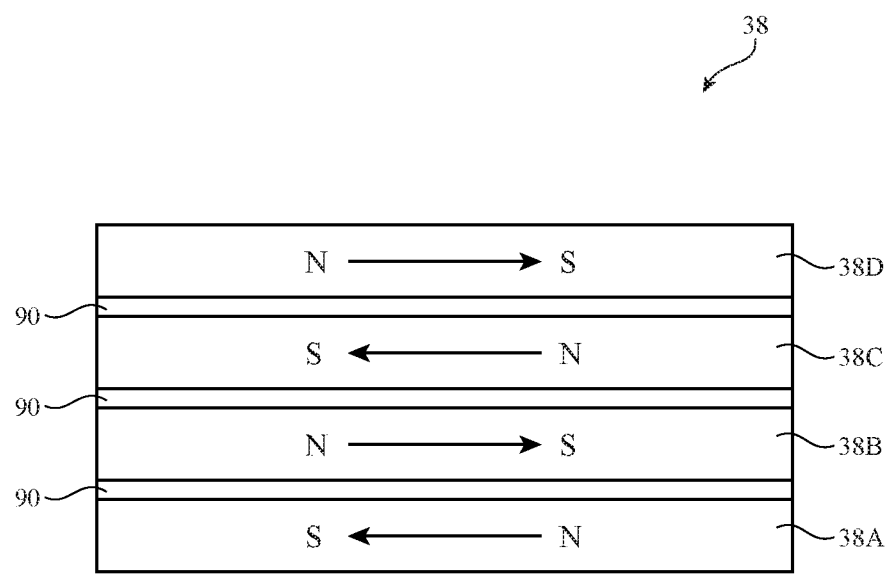
FIG. 15 is a cross-sectional side view of an illustrative magnetic flux concentrator having a stack of magnetic layers separated by interposed non-magnetic layers in accordance with an embodiment.

If desired, more than two magnetic layers may be incorporated into a magnetic flux concentrator (e.g., three or more, four or more layers, five or more layers, six or more layers, etc.). As shown in FIG. 15, for example, flux concentrator 38 may have four magnetic layers 38A, 38B, 38C, and 38D separated by respective non-magnetic layers 90. Layers 90 may have thicknesses that allow layers 38A, 38B, 38C, and 38D to magnetically couple through the Ruderman-Kittel-Kasuya-Yosida interaction (e.g., layers 90 may each be about 8 angstroms thick, 6-11 angstroms thick, etc.). Flux concentrators formed from stacked magnetic layers may be used in sensors of the types shown in FIGS. 3, 4, 6, 7, and other suitable sensors.

The foregoing is merely illustrative and various modifications can be made by those skilled in the art without departing from the scope and spirit of the described embodiments. The foregoing embodiments may be implemented individually or in any combination.

What is claimed is:

1. A magnetic sensor, comprising:
a substrate; and
a thin-film magnetic sensor element on the substrate; and
a multilayer magnetic flux concentrator on the substrate that directs magnetic flux through the thin-film magnetic sensor, wherein the multilayer magnetic flux concentrator includes at least first and second magnetic layers separated by a non-magnetic layer that causes the first and second magnetic layers to exhibit a Ruderman-Kittel-Kasuya-Yosida interaction.

2. The magnetic sensor defined in claim 1 wherein the non-magnetic layer has a thickness of 6-11 angstroms.

3. The magnetic sensor defined in claim 2 wherein the multilayer magnetic flux concentrator comprises at least a third magnetic layer stacked above the first and second magnetic layers.

4. The magnetic sensor defined in claim 3 further comprising a non-magnetic layer between the second and third magnetic layers.

5. The magnetic sensor defined in claim 4 wherein the non-magnetic layer between the second and third magnetic layers has a thickness of 6-11 angstroms.

6. The magnetic sensor defined in claim 5 wherein the thin-film magnetic sensor element comprises a giant magnetoresistance sensor element.

7. The magnetic sensor defined in claim 2 wherein the non-magnetic layer comprises ruthenium.

8. The magnetic sensor defined in claim 7 wherein the first and second magnetic layers each include a layer of CoFe adjacent to the non-magnetic layer.

9. The magnetic sensor defined in claim 1 wherein the thin-film magnetic sensor element comprises a giant magnetoresistance sensor element.

10. A magnetic sensor, comprising:
a substrate;
first and second elongated thin-film magnetic sensor elements on the substrate; and
an elongated magnetic flux concentrator interposed between the first and second elongated thin-film magnetic sensor elements, wherein the elongated magnetic flux concentrator has at least a first magnetic layer, a second magnetic layer, and a non-magnetic layer that is interposed between the first and second magnetic layers, wherein the non-magnetic layer has a thickness that allows the first and second magnetic layers to magnetically couple.

11. The magnetic sensor defined in claim 10 wherein the elongated magnetic flux concentrator has first and second opposing parallel edges and wherein the first and second elongated thin-film magnetic sensor elements run respectively along the first and second edges.

12. The magnetic sensor defined in claim 10 wherein the non-magnetic layer has a thickness of 6-11 angstroms so that the first and second magnetic layers are magnetically coupled by a Ruderman-Kittel-Kasuya-Yosida interaction.

13. The magnetic sensor defined in claim 10 wherein the first and second elongated thin-film magnetic sensor elements comprises giant magnetoresistance sensor elements.

14. The magnetic sensor defined in claim 13 wherein the elongated magnetic flux concentrator further comprises third and fourth magnetic layers, a non-magnetic layer interposed between the third and fourth magnetic layers, and a non-magnetic layer interposed between the second and third magnetic layers.

15. An electronic compass, comprising:
thin-film magnetic sensor elements;
a plurality of Z-shaped magnetic flux concentrators and reversed-Z-shaped magnetic flux concentrators that direct magnetic flux through the magnetic sensor elements; and
a resistive bridge circuit having first, second, third, and fourth arms, wherein the first and second arms contain an equal number of Z-shaped magnetic flux concentrators and wherein the first and second arms contain an equal number of reversed-Z-shaped magnetic flux concentrators.

16. The electronic compass defined in claim 15 wherein the thin-film magnetic sensor elements comprise giant magnetoresistance sensor elements.

17. The electronic device defined in claim 16 wherein the Z-shaped magnetic flux concentrators and the reversed-Z-shaped magnetic flux concentrators each have multiple magnetic layers separated by an interposed non-magnetic layer.

18. The electronic device defined in claim 17 wherein the non-magnetic layer has a thickness of 6-11 angstroms.

19. The electronic device defined in claim 18 wherein the multiple magnetic layers include a first magnetic layer having a chemically mechanically polished surface and include a second magnetic layer that is separated from the first magnetic layer by the non-magnetic layer.

20. The electronic device defined in claim 19 wherein the non-magnetic layer comprises a material that is selected from the group consisting of: copper and ruthenium.

* * * * *